(12) United States Patent
Ko et al.

(10) Patent No.: US 8,980,111 B2
(45) Date of Patent: Mar. 17, 2015

(54) SIDEWALL IMAGE TRANSFER METHOD FOR LOW ASPECT RATIO PATTERNS

(71) Applicant: Tokyo Electron Limited, Tokyo (JP)

(72) Inventors: Akiteru Ko, Schenectady, NY (US); Kosuke Ogasawara, Portland, OR (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/893,917

(22) Filed: May 14, 2013

(65) Prior Publication Data

US 2013/0306598 A1    Nov. 21, 2013

Related U.S. Application Data

(60) Provisional application No. 61/647,387, filed on May 15, 2012.

(51) Int. Cl.
```
C03C 15/00      (2006.01)
C03C 25/68      (2006.01)
C23F 1/00       (2006.01)
B44C 1/22       (2006.01)
H01L 21/302     (2006.01)
H01L 21/461     (2006.01)
H01L 21/311     (2006.01)
G03F 7/36       (2006.01)
```
(52) U.S. Cl.
CPC ........................................ *G03F 7/36* (2013.01)
USPC ................. 216/46; 216/58; 216/67; 438/689; 438/694; 438/696; 438/706; 438/710

(58) Field of Classification Search
None
See application file for complete search history.

(56) References Cited

U.S. PATENT DOCUMENTS

| | | | |
|---|---|---|---|
| 7,638,381 B2 | 12/2009 | Cheng et al. | |
| 2005/0181632 A1* | 8/2005 | Tan et al. | 438/784 |
| 2006/0172540 A1* | 8/2006 | Marks et al. | 438/700 |
| 2007/0049040 A1* | 3/2007 | Bai et al. | 438/712 |
| 2008/0057692 A1 | 3/2008 | Abatcher et al. | |
| 2009/0087977 A1* | 4/2009 | Spuller et al. | 438/593 |
| 2009/0311634 A1 | 12/2009 | Yue et al. | |
| 2010/0178770 A1* | 7/2010 | Zin | 438/694 |
| 2010/0248488 A1* | 9/2010 | Agarwal et al. | 438/714 |
| 2010/0291490 A1 | 11/2010 | Tsuruda et al. | |
| 2011/0070545 A1 | 3/2011 | Dunn et al. | |
| 2012/0128935 A1 | 5/2012 | Dunn et al. | |

OTHER PUBLICATIONS

U.S. Appl. No. 13/589,096, filed Aug. 18, 2012, Ranjan et al.
U.S. Appl. No. 13/803,473, filed Mar. 14, 2013, Ranjan et al.

* cited by examiner

Primary Examiner — Stephanie Duclair

(57) ABSTRACT

A method for patterning a substrate is described. The patterning method may include conformally depositing a material layer over a pattern according to a conformal deposition process, selectively depositing a second material layer on an exposed surface of the material layer according to a selected deposition process recipe; partially removing the material layer using a plasma etching process to expose a top surface of the pattern, open a portion of the material layer at a bottom region between adjacent features of the pattern, and retain a remaining portion of the material layer on sidewalls of the pattern; and removing the pattern using one or more etching processes to leave a final pattern comprising the remaining portion of the material layer and the second layer.

20 Claims, 8 Drawing Sheets

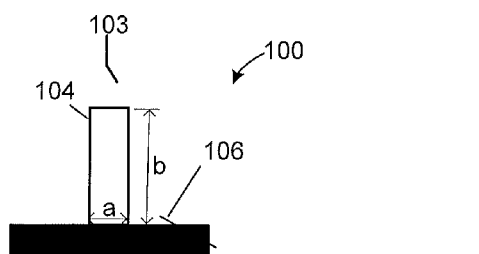
FIG. 1A Prior Art
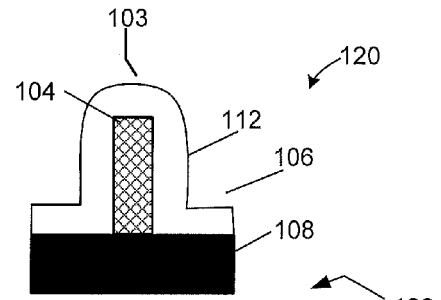
FIG. 1B Prior Art
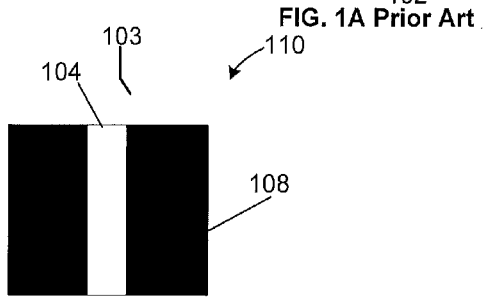
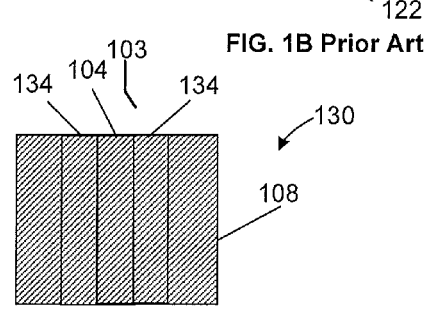
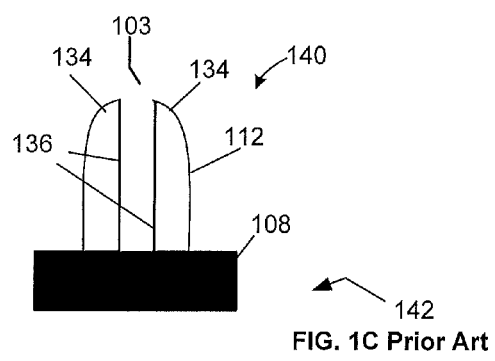
FIG. 1C Prior Art
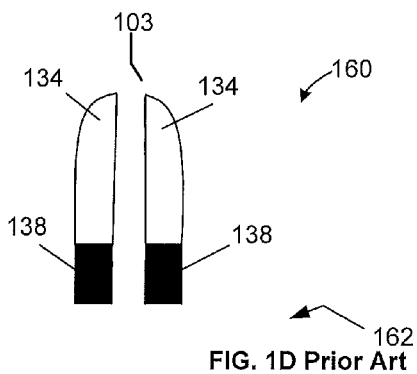
FIG. 1D Prior Art
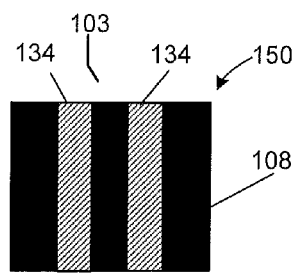
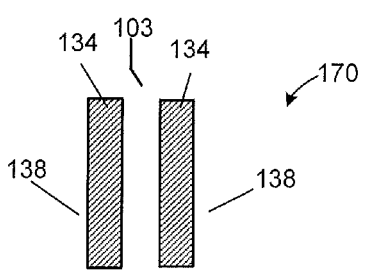

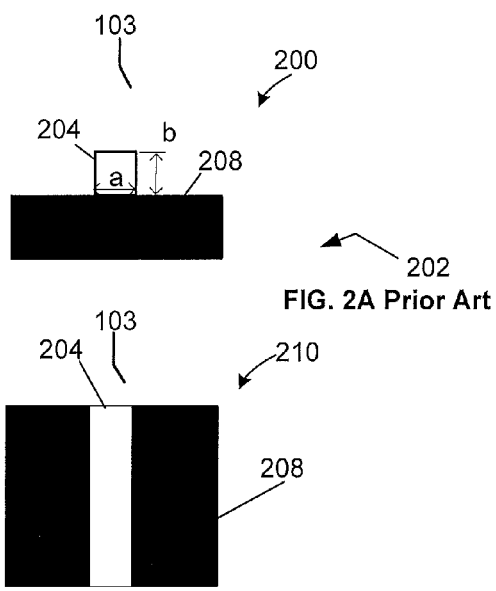
FIG. 2A Prior Art
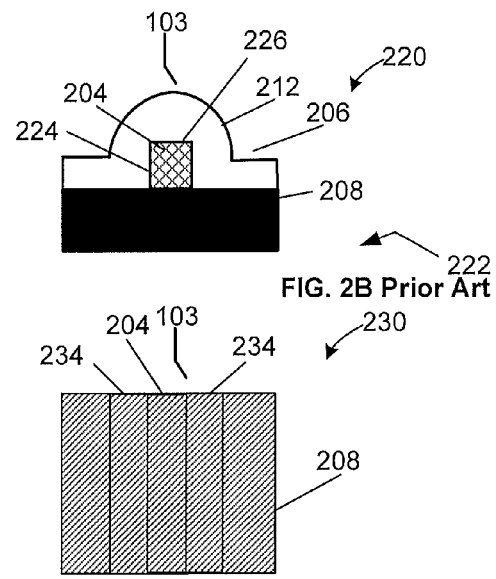
FIG. 2B Prior Art
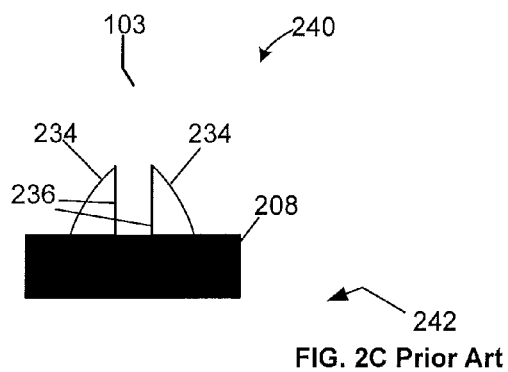
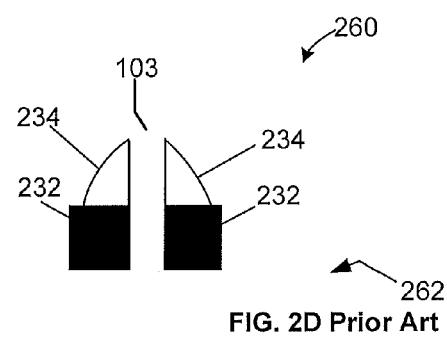
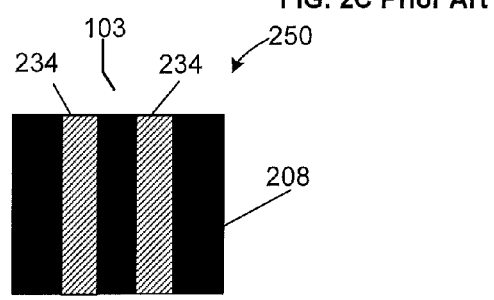
FIG. 2C Prior Art
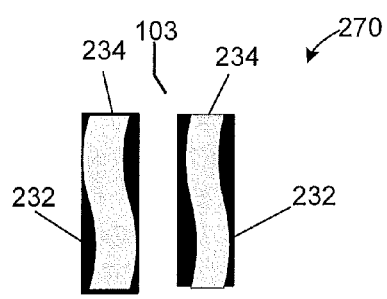
FIG. 2D Prior Art

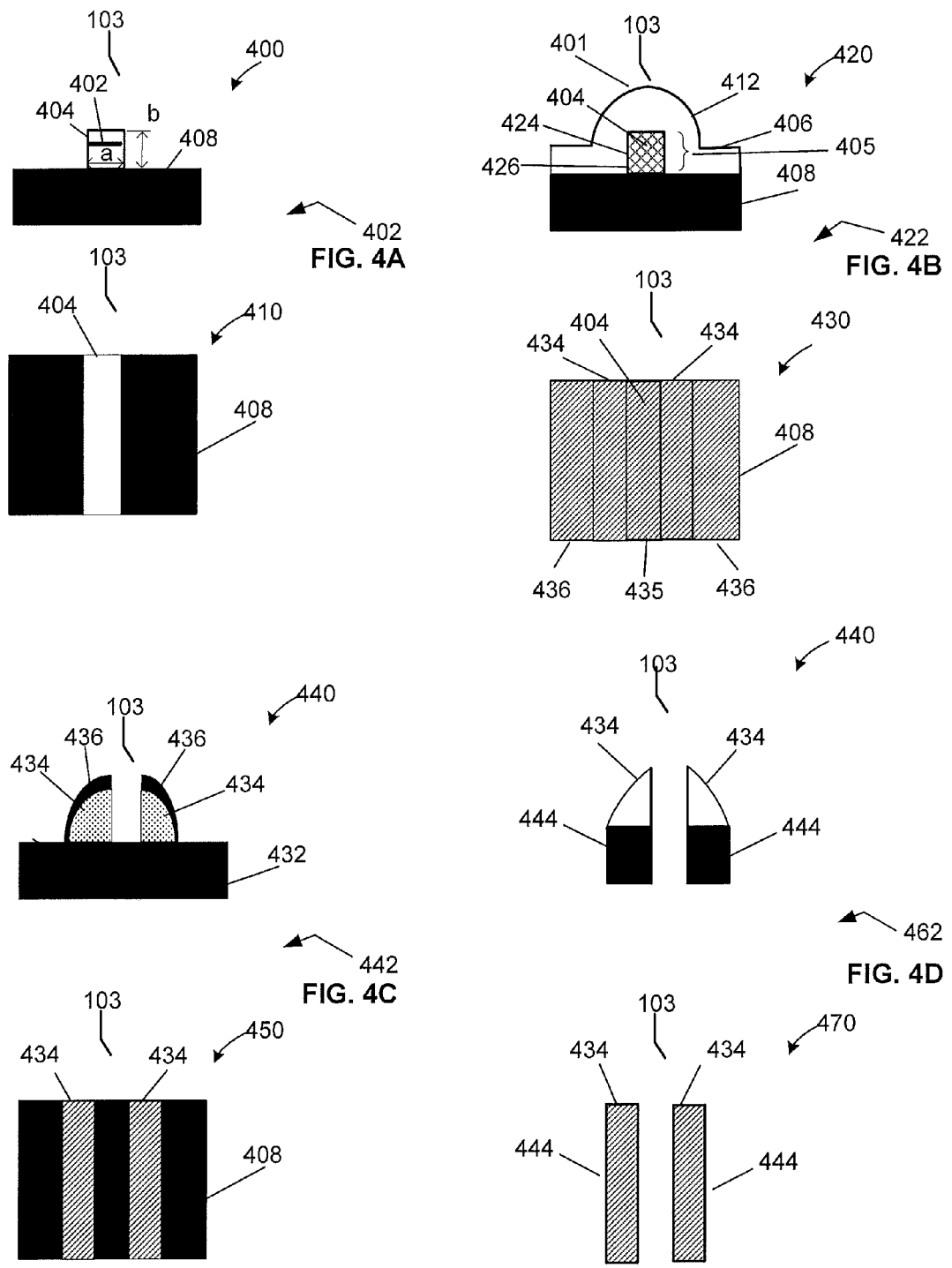

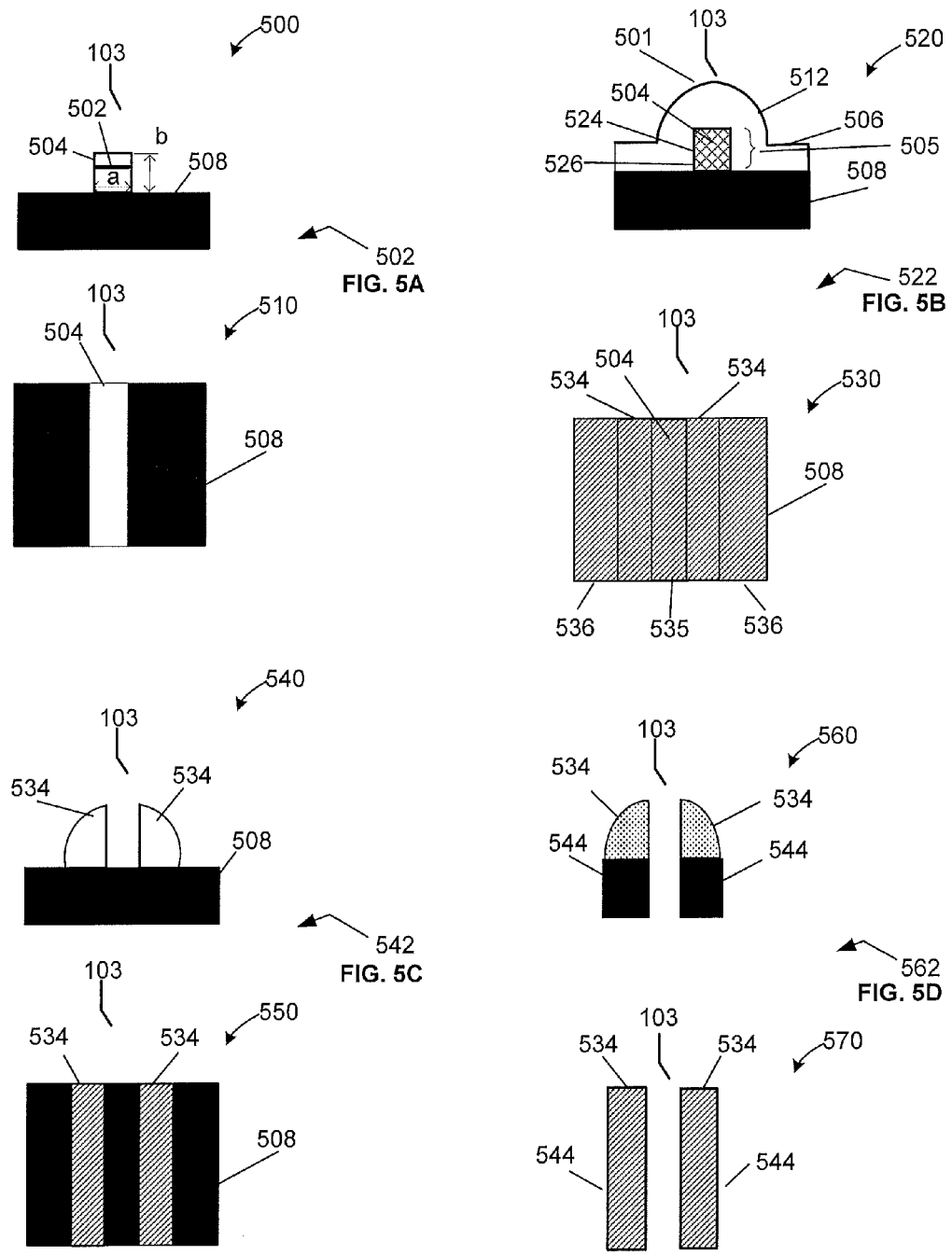

SIDEWALL IMAGE TRANSFER METHOD FOR LOW ASPECT RATIO PATTERNS

CROSS-REFERENCE TO RELATED APPLICATIONS

Pursuant to 37 CFR §1.78(a)(4), this application claims the benefit of and priority to U.S. Provisional Application Ser. No. 61/647,387, filed on May 15, 2012, the entire content of which is herein incorporated by reference.

FIELD OF INVENTION

The invention relates to a method for patterning a thin film on a substrate, and more particularly, to a method of sidewall image transfer for low aspect ratio patterns on a thin film on a substrate.

BACKGROUND OF THE INVENTION

Description of Related Art

In material processing methodologies, pattern etching comprises the application of a layer of radiation-sensitive material, such as photo-resist, to an upper surface of a substrate, the formation of a pattern in the layer of radiation-sensitive material using photo-lithography, and the transfer of the pattern formed in the layer of radiation-sensitive material to an underlying thin film on the substrate using an etching process. The patterning of the radiation-sensitive material generally involves exposure of the radiation-sensitive material to a pattern of electromagnetic (EM) radiation using, for example, a photo-lithography system, followed by the removal of the irradiated regions of the radiation-sensitive material (as in the case of positive tone resist), or non-irradiated regions (as in the case of negative tone resist) using a developing solution. To extend conventional photo-lithography to advanced technology nodes, double patterning techniques, and even quadruple patterning techniques, have been implemented. One such double patterning technique includes a sidewall image transfer (SIT) process. However, with conventional double patterning, in particular, for sidewall image transfer (SIT) processes for pattern doubling, the pattern transfer integrity is compromised if the aspect ratio (i.e., ratio of height to width) of the pattern structure, also known as mandrel pattern, lies in the range from about 0.5 to 2.5. Since the material layer thicknesses need to be very thin, e.g., for example, about 50 nm to print less than 50 nm line-and-space with photo resist (resist), the aspect ratio is always low. Consequently, when etching the spacer layer conformally applied over the resist mandrel pattern, corner rounding on the non-mandrel side of the resist mandrel pattern can cause roughness and error in CD during transfer of the SIT pattern to the underlying film.

SUMMARY OF THE INVENTION

The invention relates to a method for patterning a thin film on a substrate using a sidewall image transfer process, comprising: providing a substrate having a pattern formed in an exposed layer of said substrate, said pattern being characterized by a feature width critical dimension (CD) and said exposed layer being characterized by a film thickness; conformally depositing a material layer over said pattern; depositing a second material layer on an exposed surface of said material layer wherein depositing said second material layer uses a tailored process recipe to selectively increase a thickness of said second material layer on regions of said material layer formed on a sidewall of said pattern; partially removing said material layer using a plasma etching process to expose a top surface of said pattern, open a portion of said material layer at a bottom region between adjacent features of said pattern, and retain a remaining portion of said material layer on said sidewall of said pattern; and removing said pattern using one or more etching processes to leave a final pattern comprising said remaining portion of said material layer and said second material layer.

BRIEF DESCRIPTION OF THE DRAWINGS

In the accompanying drawings:

FIGS. 1A to 1D present a simplified schematic representation of a prior art method of patterning a substrate according to when the aspect ratio exceeds 2.5;

FIG. 2A to 2D illustrates the patterning a substrate with a simplified schematic representation of a prior art method of patterning a substrate when the aspect ratio is close to 2.5 and lower;

FIGS. 4A to 4D present a simplified schematic representation of a method of patterning a substrate according to an embodiment of the present invention;

FIGS. 5A to 5D present a simplified schematic representation of a method of patterning a substrate according to another embodiment of the present invention;

DETAILED DESCRIPTION OF SEVERAL EMBODIMENTS

Figure 3A:
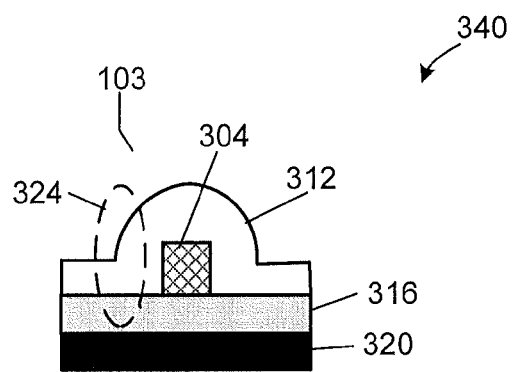
FIGS. 3A, 3B, and 3C depict simplified schematic representations of the difference in mask loss as a function of the aspect ratio of the pattern that is transferred to the underlayer.

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Referring now to the drawings, wherein like reference numerals designate identical or corresponding parts throughout the several views, FIGS. 1A to 1D present simplified schematic representations of a prior art method of patterning a substrate 108 when the aspect ratio is higher than 2.5. As depicted in FIG. 1A, a simplified schematic representation 102 of the prior art method of patterning the substrate 108 when the aspect ratio, the feature thickness b divided by the critical dimension a, is higher than 2.5 is presented. The corresponding top-view image 110 of the structure 103 is also depicted as part of FIG. 1A. In FIG. 1B, depicted is a structure 103 formed with a prior art method step of depositing a conformal layer 112 over the feature 104 and over the substrate region 106 above the substrate 108. The corresponding top-view image 130 of the structure 103 is also depicted in FIG. 1B.

FIG. 1C depicts a simplified schematic representation 142 of the prior art method step where the conformal layer 112 is partially removed using a plasma etching process to expose a top surface 135 of the feature 104, a portion of the conformal layer 112 at the bottom region 106 between adjacent features 134 of the feature 104 is opened, and a remaining portion of the conformal layer 112 on the sidewall 136 of the feature 104 is retained. The corresponding top-view image 150 of the structure 103 is also depicted in FIG. 1C. FIG. 1D depicts the prior art method step where an etching process is used to leave a final pattern 103 comprising the remaining portion of the material layer 112. The corresponding top-view image 170 of the pattern 103 is also depicted in FIG. 1D. As mentioned above, when the material layer thicknesses need to be very thin, the fabrication of line and space structures is feasible as long as the aspect ratio is higher than 2.5.

FIG. 2A to 2D illustrates the patterning of a substrate with simplified schematic representation of a prior art method of patterning a substrate 208 when the aspect ratio is 2.5 or lower. As depicted in FIG. 2A, a simplified schematic representation 202 of the prior art method of patterning the substrate 208 when the aspect ratio, the feature thickness b divided by the critical dimension a, is higher than 2.5 is presented. The corresponding top-view image 210 of the pattern 103 is also depicted as part of FIG. 2A. In FIG. 2B, depicted is a structure 103 formed with a prior art method step of depositing a conformal layer 212 over the feature 204 and over the substrate region 206 above the substrate 208. The corresponding top-view image 230 of the pattern 103 is also depicted in FIG. 2B.

FIG. 2C depicts a simplified schematic representation 242 of the prior art method step where the conformal layer 212 is partially removed using a plasma etching process to expose a top surface 226 of the feature 204, a portion of the conformal layer 212 at a bottom region 206 between adjacent features 234 of the feature 204 is opened, and a remaining portion of the conformal layer 212 on the sidewall 236 of the feature 204 is retained. FIG. 2D depicts the prior art method step where an etching process is used to leave a final pattern 103 comprising the remaining portion of the material layer 212. The retained portion of the adjacent features 234 on top of the retained portion of the substrate 426 show erosion of the adjacent features 234. The corresponding top-view image 270 of the pattern 103 depicted in FIG. 2D shows CD loss and a line edge roughness (LER) that has been shown to negatively affect the performance of the pattern. The corresponding top-view image 270 of the pattern 103 is also depicted in FIG. 2D. As mentioned above, the fabrication of line-and-space structures where the aspect ratio is higher than 2.5 is a known process with good results. However, with conventional double patterning, in particular, for sidewall image transfer (SIT) processes for preparing double patterns, the pattern transfer integrity is compromised if the pattern aspect ratio is in the range from 0.5 to 2.5. Since the resist thickness needs to be very thin, e.g., about 50 nm to print less than 50 nm line-and-space with photo resist (resist), the aspect ratio is always low. Consequently, when etching the spacer layer conformally applied over the resist mandrel pattern, corner rounding on the non-mandrel side of the resist mandrel pattern can cause roughness and error in CD during transfer of the SIT pattern to the underlying film.

Figure 3B:
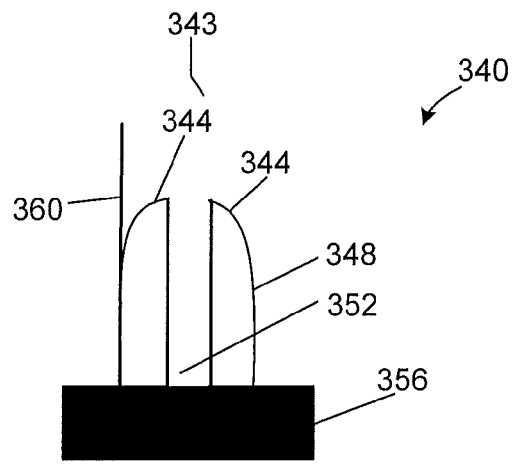
Figure 3C:
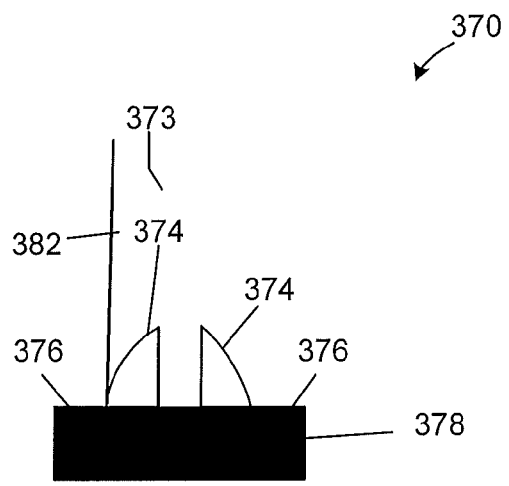

FIGS. 3A, 3B, and 3C depict simplified schematic representations of the difference in mask loss as a function of the aspect ratio of the pattern that is transferred to the underlayer. FIG. 3A depicts a side-view image 300 of a pattern 103 comprising a conformal layer 312 over a feature 304, a first underlying layer 316, and a second underlying layer 320. The shape of the area inside the oval shape 324 determines largely what happens during the removal of the pattern with the one or more etch processes. In FIG. 3B where the aspect ratio is greater than 2.5, the rounded corner is protected from erosion due to the higher thickness of the feature and subsequently the thickness of the conformal layer. In contrast in FIG. 3C, the rounded corner of features 374 close to the substrate region 376 easily causes mask loss when the pattern is transferred to the underlying layers 378.

FIGS. 4A to 4D present simplified schematic representations of a method of patterning a substrate according to an embodiment of the present invention. FIG. 4A presents a simplified schematic representation 402 of the method of patterning the substrate 408 when the aspect ratio is substantially in the range from 0.5 to 2.5. The side view image 400 includes the substrate 408 and a feature 404 on the substrate 408, the feature characterized by the feature thickness b and CD a. The corresponding top-view image 410 of the feature 404 is also depicted as part of FIG. 4A. FIG. 4B presents the pattern 103 formed with a method step of depositing a conformal layer 412 over the feature 404 and over the substrate region 406 above the substrate 408. The feature 404 has a feature top surface 426 and sidewall 424. The feature 404 comprises a patterned film stack of one or more layers 405 that may include, among other things, a gate capping layer, a gate electrode layer, a gate dielectric layer, a gate interfacial layer, etc. The gate capping layer may include an oxide, such as $SiO_2$. The gate structure 103 may further include an additional spacer material. The corresponding top-view image 430 of the pattern 103 is also depicted in FIG. 4B. The middle capping layer 435 over the feature 404 is adjacent to the two sidewall spacers 434. The two sidewall spacers 434 are situated next to the two spacer material layers 436 above the substrate region 406.

FIG. 4C presents a simplified schematic representation of the method step where a second material is deposited on an exposed surface of the material conformal layer 412, the depositing of the second material layer is performed using a tailored recipe. Furthermore, the conformal layer 412 is partially removed using a plasma etching process to expose a top surface 435 of the feature 404, a portion of the conformal layer 412 at a bottom region 406 between adjacent features 434 of the feature 404 is opened, and a remaining portion of the conformal layer 412 on the sidewall 436 of the feature 404 is retained. FIG. 4D depicts the method step where an etching process is used to leave a final pattern 103 comprising the remaining portion of the material layer 412. The etching process will be described in detail with FIG. 7. The retained portion of the sidewall spacers 434 on top of the retained portion of the substrate 444 show better LER and maintenance of the CD of the sidewall spacers 434. The corresponding top-view image 470 of the pattern 103 depicted in FIG. 4D shows CD loss and an LER that are in the acceptable ranges for the application.

FIGS. 5A to 5D present a simplified schematic representation of a method of patterning a substrate according to another embodiment of the present invention. FIG. 5A presents a simplified schematic representation 502 of the method of patterning the substrate 508 when the aspect ratio is substantially in the range of 0.5 to 2.5. The side view image 500 includes the substrate 508 and a feature 504 on the substrate 508, the feature characterized by the feature thickness b and CD a. The corresponding top-view image 510 of the feature 504 is also depicted as part of FIG. 5A. FIG. 5B presents the side view image 520 of the pattern 103 formed with a method step of depositing a conformal layer 512 over the feature 504 and over the substrate region 506 above the substrate 508. The corresponding top-view image 530 of the pattern 103 is also depicted in FIG. 5B. The middle capping layer 535 over the feature 504 is adjacent to the two sidewall spacers 534. The two sidewall spacers 534 are situated next to the two spacer material layers 536 in the substrate region 506 of the of the conformal layer 512.

FIG. 5C presents a simplified schematic representation of the method step where the conformal layer 512 is partially removed using a plasma etching process to remove the middle capping layer 535, expose a top surface of the feature 504, a portion of the conformal layer 512 at a bottom region 506 between sidewall spacers 534 of the feature 504 is opened, and a remaining portion of the conformal layer 512 on the sidewall 536 of the feature 504 is retained. The plasma etching process is controlled using a range of operating variables selected for the application and will be described in detail with the discussion related to FIG. 8. The corresponding top-view image 550 of the pattern 103 depicted in FIG. 5 shows the sidewall spacers 534 and the substrate 508. FIG. 5D depicts the method step where an etching process is used to leave a final pattern 103 comprising the remaining portion of the material layer 512. The etching process will be described in detail with the discussion related to FIG. 8. The retained portion of the sidewall spacers 534 on top of the retained portion of the substrate 544 show better LER and maintenance of the CD of the sidewall spacers 534. The corresponding top-view image 570 of the pattern 103 depicted in FIG. 5D shows CD loss and an LER that are in the acceptable ranges for the application.

Figure 6:
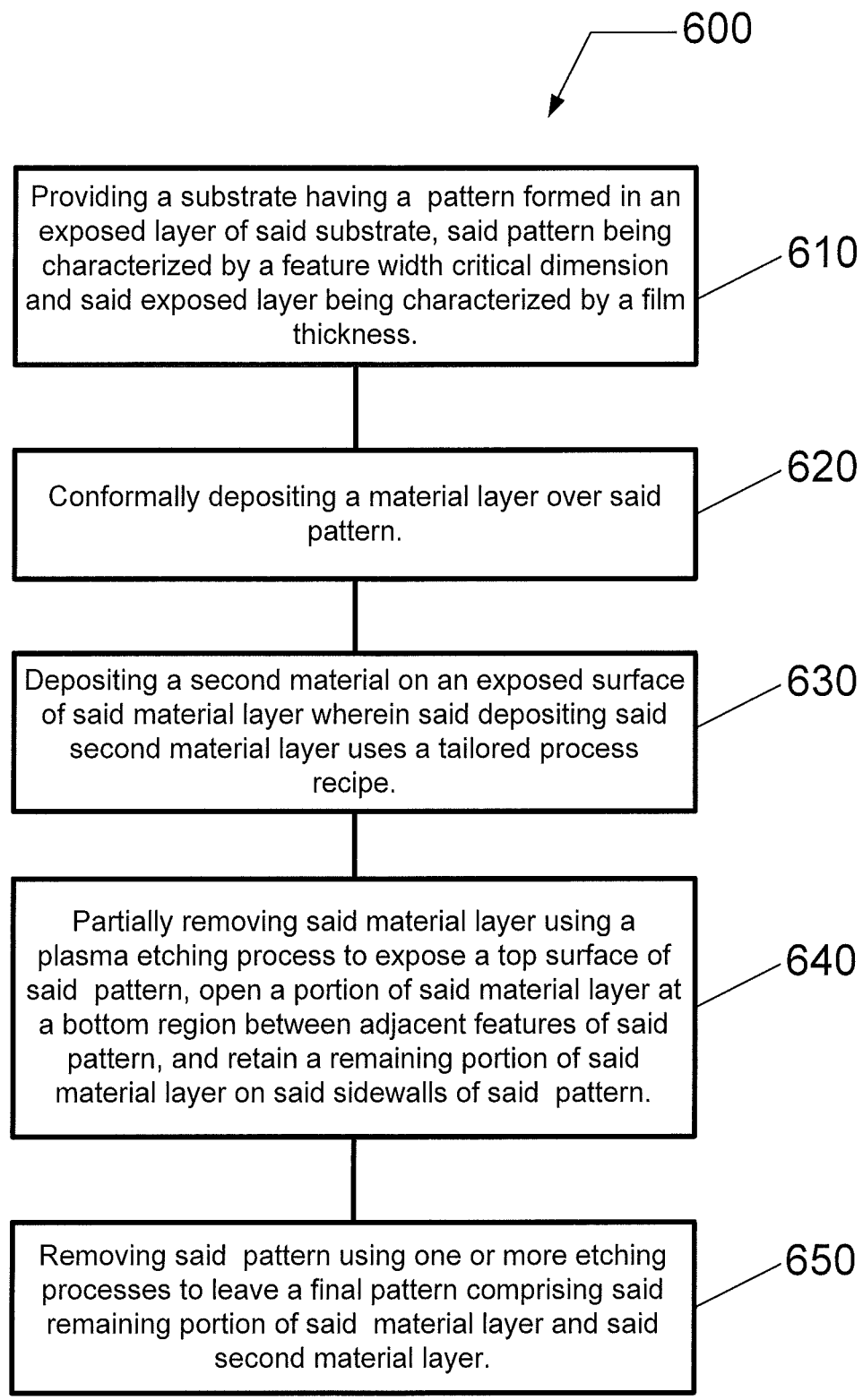
FIG. 6 presents an exemplary flowchart of an embodiment of the present invention.

FIG. 6 presents an exemplary flowchart 600 of an embodiment of the present invention. The flowchart starts with operation 610 providing a substrate having a pattern formed in an exposed layer of said substrate, said pattern being characterized by a feature width critical dimension and said exposed layer being characterized by a film thickness. The exposed layer of said substrate can be a layer of radiation-sensitive material or resist. Operation 620 proceeds with conformally depositing a material layer 412 over said pattern. The material layer can comprise silicon oxide or silicon nitride. The pattern 103 in FIG. 4A to 4D can be used for preparing a gate structure on a substrate. The gate structure may include a two-dimensional (2D) gate structure (or planar gate structure), three-dimensional (3D) gate structures, such as a FIN-FET (fin field-effect transistor), as well as other structures over which a sidewall image transfer process may be used to pattern.

Additionally, the material layer 412, as deposited, may be characterized by a dielectric constant having an initial value that is less than 7.5. For example, the material layer 412, as deposited, may be characterized by a dielectric constant having an initial value that ranges from about 4.0 to about 7.0. Alternatively, for example, the dielectric constant may have an initial value that ranges from about 5.0 to about 6.0. Alternatively yet, for example, the dielectric constant may have an initial value that ranges from about 5.0 to about 5.5.

Furthermore, the material layer 412 may be formed using a vapor deposition process, such as chemical vapor deposition (CVD), plasma-enhanced CVD (PECVD), filament-assisted CVD (FACVD), atomic layer deposition (ALD), or plasma-enhanced ALD (PEALD). Additionally, the material layer 412, conformally applied over the pattern 103, may have a thickness less than or equal to about 20 nm, or less than or equal to about 10 nm.

The pattern 103 may be used to pattern a film stack of one or more layers underlying layer 405 that may include, among other things, a gate capping layer, a gate electrode layer, a gate dielectric layer, a gate interfacial layer, etc. The gate capping layer may include an oxide, such as $SiO_2$.

The gate electrode layer may include a layer of polycrystalline silicon (polysilicon, or poly-Si) and/or a metal-containing layer. The metal-containing layer may include a metal, a metal alloy, a metal nitride, or a metal oxide, and may contain, for example, titanium, titanium aluminum alloy, tantalum, tantalum aluminum alloy, titanium nitride, titanium silicon nitride, titanium aluminum nitride, tantalum nitride, tantalum silicon nitride, hafnium nitride, hafnium silicon nitride, aluminum nitride, or aluminum oxide. The metal-containing layer may replace or be integrated with a traditional poly-Si gate electrode layer.

The gate dielectric may include $SiO_2$, or a high-k (high dielectric constant) layer, and may, for example, include a lanthanum-containing layer, such as lanthanum oxide ($La_2O_3$), or a hafnium containing layer, such as a hafnium oxide layer (e.g., $HfO_x$, $HfO_2$), a hafnium silicate layer (e.g., HfSiO), or a nitrided hafnium silicate (e.g., HfSiO(N)). Additionally, for example, the high-k layer may incorporate metallic silicates or oxides (e.g., $Ta_2O_5$ (k~26), $TiO_2$ (k~80), $ZrO_2$ (k~25), $Al_2O_3$ (k~9)). Furthermore, for example, the high-k layer may include mixed rare earth oxides, mixed rare earth aluminates, mixed rare earth nitrides, mixed rare earth aluminum nitrides, mixed rare earth oxynitrides, or mixed rare earth aluminum oxynitrides. The gate interfacial layer may include a thin layer of silicon dioxide ($SiO_2$) disposed between the high-k layer and the substrate 408.

The substrate 408 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate. The pattern 103 may be used to pattern fins in the substrate 108.

In operation 630, a second material is deposited on an exposed surface of said material layer wherein said depositing said second material layer 436 uses a tailored process recipe. With certain process conditions and chemistry, film-forming constituent of the plasma, such as polymerizing material, can have a relatively high degree of stickiness such that a given polymerizing material adheres to a first surface encountered and forms a polymeric-like film. Upper surfaces are typically encountered first by film-forming constituents traveling in random directions toward the substrate 408. Accordingly, more film-forming constituent collects at the top of structures, and less film-forming constituent collects on surfaces of the structure that approach the substrate because the supply of film-forming constituent lessens. In other words, collection of film-forming constituent on surfaces of device structures is dependent on visibility to the plasma chemistry or "seeing" the plasma chemistry. Accordingly, surfaces that are shadowed get proportionally less exposure as the film-forming constituent descends isotropically, while surfaces that are higher or closer to the plasma collect more film-forming constituents. The result is a relatively small amount of film-forming constituent (protection layer) on lower surfaces, while there is comparatively more film-forming constituent on the taller/tallest surfaces—that is, farthest from the substrate or closest to the plasma chemistry source.

Note that this aspect ratio dependent deposition is generally isotropic deposition. In alternative embodiments, however, a bias power can be supplied such the monomer/polymer ion species can be deposited anisotropically. The bias power can be tuned to balance an amount of anisotropic deposition compared to isotropic deposition. Such bias power tuning can be used to balance deposition amounts between upper and lower surfaces, and also between horizontal and vertical surfaces. With more anisotropic deposition, horizontal surfaces—both upper and lower—will receive approximately equal amounts of polymer, while vertical surfaces receive relatively little deposition. With more isotropic deposition, upper horizontal surfaces and upper vertical surfaces will receive more polymer as compared to lower vertical and lower horizontal surfaces.

By way of a non-limiting example, depositing the second material layer 436 on the conformally applied material layer 412 can include depositing a SiOCl-containing layer. The term second material and protection layer shall be used in this application to mean the same entity. The SiOCl-containing layer contains Si, O, and Cl. In an embodiment, the second material layer 436 can be a low temperature oxide. The second material layer 436 can be formed by performing a vapor deposition process in an environment containing Si, Cl, and O. In one embodiment, the second material layer 436 is formed by performing a plasma-assisted deposition process that includes generating plasma using a film forming process composition containing as incipient ingredients $SiCl_4$ and $O_2$. While the film forming process composition includes $SiCl_4$ and $O_2$, other Cl-containing and O-containing gases or vapors can be substituted or added. For example, the protection layer process composition may include, as incipient ingredients, silane ($SiH_4$), a Cl-containing gas (e.g., $Cl_2$, HCl, etc.), and an oxygen-containing gas (e.g., $O_2$). To form the plasma in the plasma-assisted deposition process, constituents of the film forming process composition should be selected that exist in a gaseous and/or vapor phase either alone or in combination with a carrier gas (e.g., a noble gas element or nitrogen) at atmospheric and/or vacuum pressures. While Cl is described above, the halogen element may also include F or Br.

Alternatively, the second material layer 436 may contain C and at least one element selected from the group consisting of F and H. The second material layer 436 may be formed by performing a vapor deposition process in an environment containing C and at least one element selected from the group consisting of F and H. In one embodiment, the second material layer 436 is formed by performing a plasma-assisted deposition process that includes generating plasma using a film forming process composition containing as incipient ingredients a fluorocarbon gas expressed as $C_xH_yF_z$, where x and z are non-zero. For example, the fluorocarbon gas may include $CF_4$, $C_4F_6$, $C_4F_8$, $C_5F_8$, $CH_3F$, $CHF_3$, $CH_2F_2$, etc. For example, the film forming process composition may include as incipient ingredients $C_4F_8$ and Ar.

In another embodiment, the second material layer 436 is formed by performing a plasma-assisted deposition process that includes generating plasma using a film forming process composition containing as incipient ingredients a hydrocarbon gas expressed as $C_xH_y$, where x and y are non-zero. For example, the hydrocarbon gas may include $CH_4$, $C_2H_2$, $C_2H_4$, $C_2H_6$, $C_3H_8$, etc. To form the plasma in the plasma-assisted deposition process, constituents of the film forming process composition should be selected that exist in a gaseous and/or vapor phase either alone or in combination with a carrier gas (e.g., a noble gas element or nitrogen) at atmospheric and/or vacuum pressures.

In operation 640, said material layer is partially removed using a plasma etching process to expose a top surface of said pattern, open a portion of said material layer at a bottom region between adjacent features of said pattern, and retain a remaining portion of said material layer on said sidewalls of said pattern. A spacer etch process sequence is performed to partially remove the material layer 412 from the pattern 103 and the substrate 408, while retaining a sidewall spacer 434 positioned along a sidewall 424 of the pattern 103. The partial removal of the material layer 412 may include removing the material layer 412 from a capping region 401 of the pattern 103 and a substrate region 406 on substrate 408 adjacent a base 426 of the pattern 103.

In operation 650, said pattern is removed using one or more etching processes to leave a final pattern comprising said remaining portion of said material layer and said second material layer. One or more etching processes are performed to selectively and anisotropically remove the second material layer 436 and the material layer from the capping region 401 of the pattern 103 and from the substrate region 406 on the substrate 408 adjacent the base 426 of the pattern 103 to leave behind a sidewall spacer 434 on the sidewall 404 of the structure 103 (see FIG. 4B). The sidewall spacer 434 may include a sidewall portion 255 of the material layer 412, and possibly, a residual portion of the second material layer 436.

The one or more etching processes may include a plasma etching process that involves forming plasma from an etching process composition and exposing the substrate 408 to the plasma. The etching process composition may contain a halomethane gas. The halomethane gas may include a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

Additionally, for example, the etching process composition may contain a hydrocarbon (i.e., $C_xH_y$, where x and y are equal to unity or greater). Alternatively, for example, the etching process composition may contain a fluorocarbon (i.e., $C_xF_y$, where x and y are equal to unity or greater). Alternatively yet, for example, the etching process composition may contain a gas having the chemical formula $C_xH_yR_z$, where R is a halogen element, x and y are equal to unity or greater, and z is equal to zero or greater.

The etching process composition may contain a fluorine-containing gas, a chlorine-containing gas, a bromine-containing gas, or a halide gas. For example, the etching process composition may contain HBr, $F_2$, $Cl_2$, $Br_2$, $BCl_3$, $NF_3$, or $SF_6$.

The etching process composition may contain a noble gas. The etching process composition may contain an oxygen-containing gas, a hydrogen-containing gas, a nitrogen-containing gas, or a carbon-containing gas, or any combination of two or more thereof. For example, the etching process composition may contain $H_2$, $O_2$, $N_2$, CO, $CO_2$, $NH_3$, NO, $N_2O$, or $NO_2$, or any combination of two or more thereof.

To form the plasma in the plasma etching process, constituents of the etching process composition should be selected that exist in a gaseous and/or vapor phase either alone or in combination with a carrier gas (e.g., a noble gas element or nitrogen) at atmospheric and/or vacuum pressures.

In one embodiment, the etching process composition may contain $CH_3F$ and Ar. In another embodiment, the etching process composition may contain $CH_3F$, $O_2$, and Ar. In yet another embodiment, the etching process composition may contain $CF_4$ and Ar.

As described above, substrate 408 is exposed to the plasma to selectively and anisotropically remove the second material layer 436 and the material layer 412 from the capping region 401 of the structure 103 and from the substrate region 406 on the substrate 408 adjacent the base 426 of structure 103. The one or more etching processes may include preparation of an etch process recipe. The etch process recipe may include one or more process conditions defined by one or more process parameters. The one or more process conditions may be established by setting one or more process parameters, such as: setting a flow rate of the process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to a source antenna or electrode opposing the lower electrode above the substrate; setting a temperature condition for the plasma processing system; setting a temperature condition for the substrate or substrate holder; setting an etch time; and/or setting an over-etch time. During the etching process, any one of the process parameters may be varied.

In one embodiment, a plasma etching process may comprise a process parameter space that includes: a chamber pressure ranging up to about 1000 mtorr (millitorr) (e.g., up to about 200 mtorr, or ranging from about 30 to about 100 mtorr), a process gas flow rate ranging up to about 2000 sccm (standard cubic centimeters per minute) (e.g., up to about 1000 sccm, or about 1 sccm to about 200 sccm), an optional additive gas flow rate ranging up to about 2000 sccm (e.g., up to about 1000 sccm, or up to about 100 sccm, or up to about 10 sccm), an optional noble gas (e.g., He or Ar) flow rate ranging up to about 2000 sccm (e.g., up to about 2000 sccm, or up to about 1000 sccm), a plasma source power ranging up to about 3000 W (watts) (e.g., up to about 2500 W, or ranging from about 1500 W to about 2500 W), and a lower electrode RF power level for electrically biasing the substrate ranging up to about 1000 W (e.g., up to about 500 W, or up to about 300 W, or up to 250 W). Also, the plasma source can operate at an RF or microwave frequency, e.g., 10 MHz to 5 GHz. In addition, the lower electrode bias frequency can range from about 0.1 MHz to about 200 MHz, e.g., about 2 MHz or 13.56 MHz.

As illustrated in FIG. 6, following the performing of the one or more etching processes, the residual portion of the second material layer 436 may be selectively removed from the sidewall spacer 434. In one embodiment, the selective removal of the residual portion 444 of the second material layer 436 is achieved by performing a wet cleaning process. For example, the wet cleaning process may include immersing the residual portion 444 of the second material layer 436 in an HF solution, such as a dilute aqueous HF solution.

In one embodiment, the deposition process for forming the second material layer 436, and the one or more etching processes are performed in the same plasma processing system. In an alternate embodiment, the deposition process for forming the second material layer 436, and the one or more etching processes are performed in separate plasma processing systems.

In another embodiment, the deposition process for forming the second material layer 436, and the one or more etching processes are repeated multiple cycles, e.g., two or more cycles until the material layer 412 is removed from the capping region 401 of the structure 103 and from the substrate region 406 on substrate 408 to leave behind the sidewall spacer 434.

In another embodiment, the one or more etching processes may include multiple process steps. In yet another embodiment, an over-etch process may be performed.

In one example, a second material layer containing C and F was vapor deposited using a $C_4F_8$/Ar-based deposition chemistry on a first material layer. The spacer sidewall was formed using a spacer etch process sequence that included a $CH_3F$/$O_2$/Ar-based etch chemistry. Addition of a fluorocarbon gas, such as $C_4F_8$, or a Si- and Cl-containing gas, such as $SiCl_4$, to the spacer etch process may be used to etch the spacer and deposit the second material layer on the remaining sidewall spacer.

Figure 7:
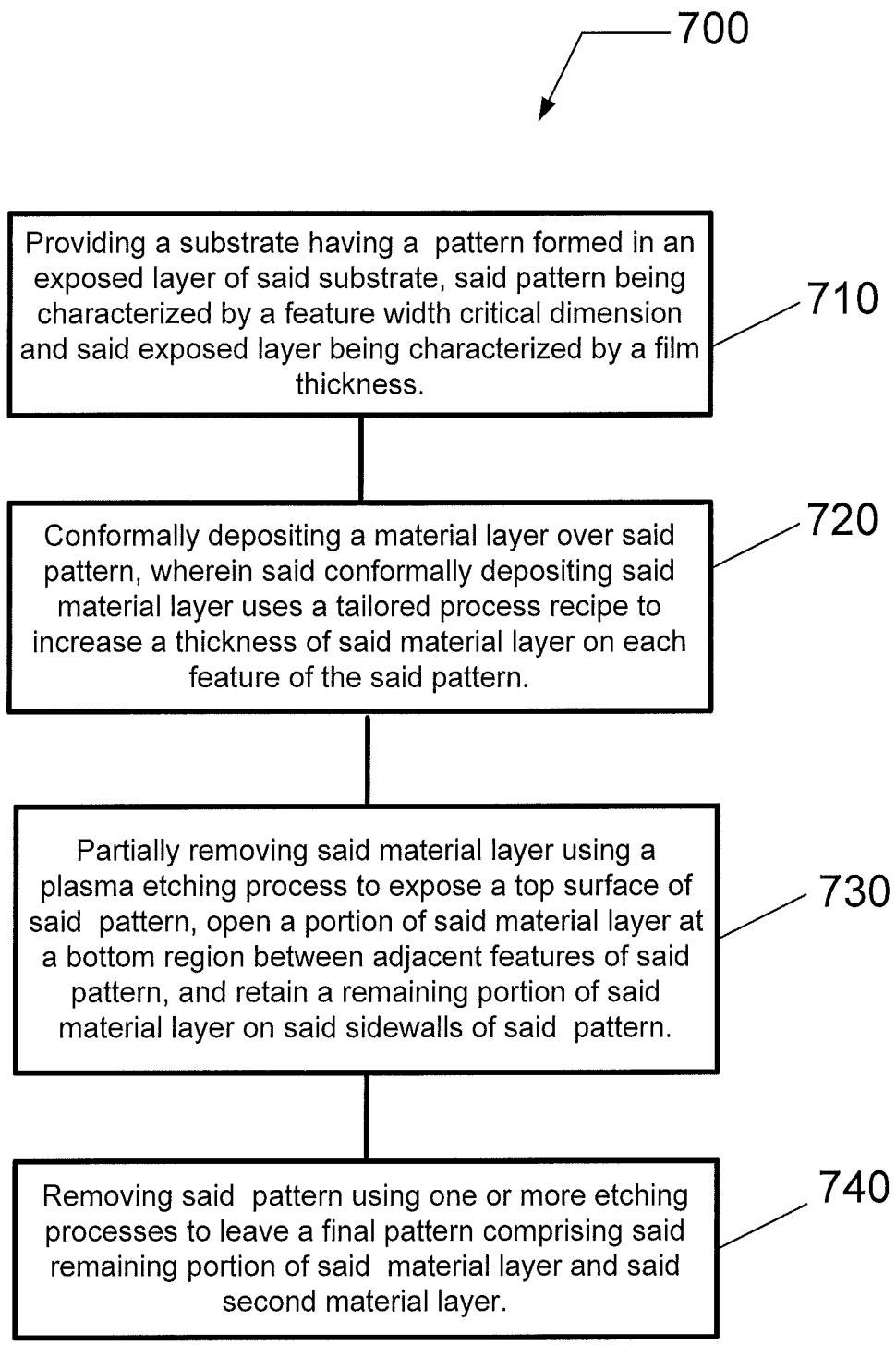
FIG. 7 presents an exemplary flowchart of an embodiment of the present invention.

FIG. 7 presents an exemplary flowchart of an embodiment of the present invention. The method in FIG. 7, operation 710 starts with providing a substrate having a pattern formed in an exposed layer of said substrate, said pattern being characterized by a feature width critical dimension and said exposed layer being characterized by a film thickness. In operation 720, a material layer conformally deposited over said pattern, wherein said conformally depositing said material layer uses a tailored process recipe to increase a thickness of said material layer on each feature of the said pattern. Operation 710 and 720 are exactly the same as operation 610 and 620 in FIG. 6.

In operation 730, said material layer is partially removed using a plasma etching process to expose a top surface of said pattern, open a portion of said material layer at a bottom region between adjacent features of said pattern, and retain a remaining portion of said material layer on said sidewalls of said pattern.

In operation 740, said pattern is removed using one or more etching processes to leave a final pattern comprising said remaining portion of said material layer and said second material layer.

Figure 8:
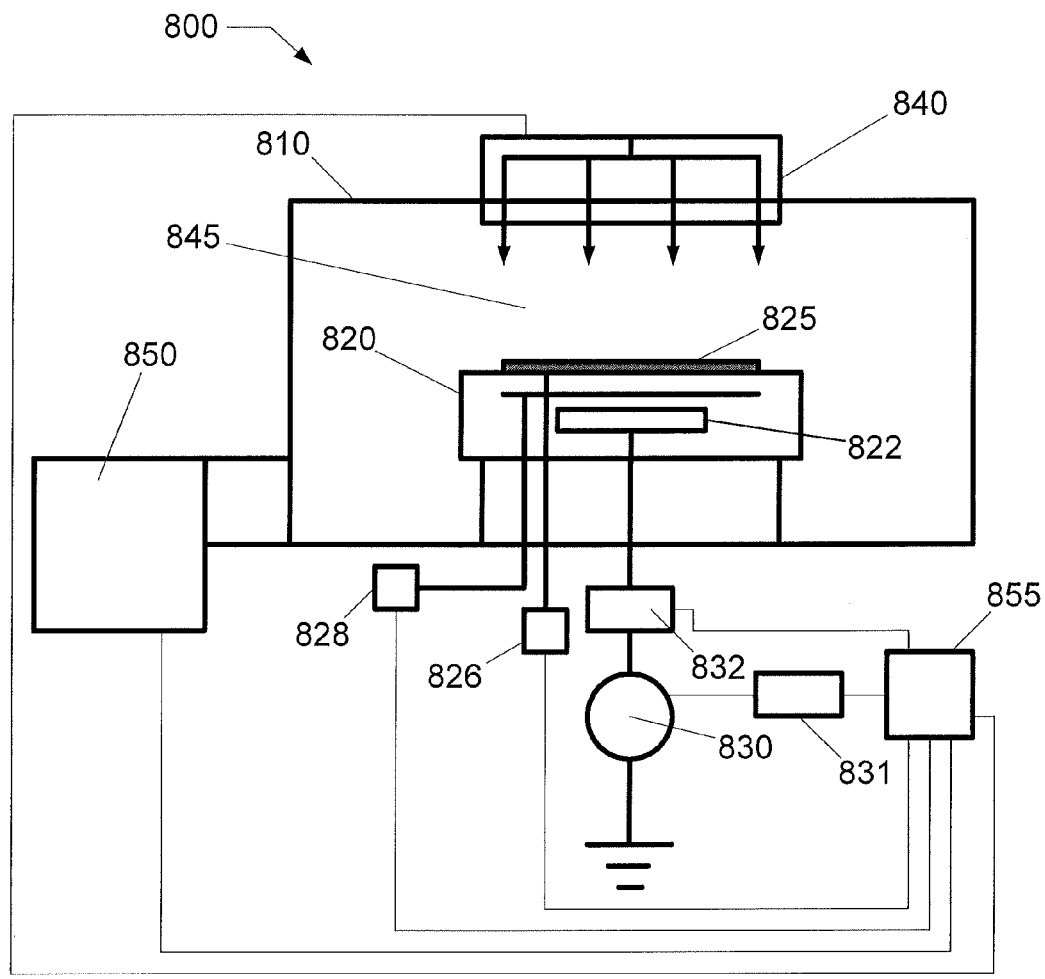
FIG. 8 shows a schematic representation of an etch processing system according to an embodiment.

FIG. 8 shows a schematic representation of an etch processing system according to an embodiment. One or more of the methods for performing a spacer etch process sequence according to various embodiments described above may be performed in any one of a number of plasma processing systems, one illustrated in FIG. 8 and described below.

A plasma processing system 800 configured to perform the above identified process conditions is depicted in FIG. 8 comprising a plasma processing chamber 810, substrate holder 820, upon which a substrate 825 to be processed is affixed, and vacuum pumping system 850. Substrate 825 can be a semiconductor substrate, a wafer, a flat panel display, or a liquid crystal display. Plasma processing chamber 810 can be configured to facilitate the generation of plasma in plasma processing region 845 in the vicinity of a surface of substrate 825. An ionizable gas or mixture of process gases is introduced via a gas distribution system 840. For a given flow of process gas, the process pressure is adjusted using the vacuum pumping system 850. Plasma can be utilized to create materials specific to a pre-determined materials process, and/or to aid the removal of material from the exposed surfaces of substrate 825. The plasma processing system 800 can be configured to process substrates of any desired size, such as 200 mm substrates, 300 mm substrates, or larger.

Substrate 825 can be affixed to the substrate holder 820 via a clamping system 828, such as a mechanical clamping system or an electrical clamping system (e.g., an electrostatic clamping system). Furthermore, substrate holder 820 can include a heating system (not shown) or a cooling system (not shown) that is configured to adjust and/or control the temperature of substrate holder 820 and substrate 825. The heating system or cooling system may comprise a re-circulating flow of heat transfer fluid that receives heat from substrate holder 820 and transfers heat to a heat exchanger system (not shown) when cooling, or transfers heat from the heat exchanger system to substrate holder 820 when heating. In other embodiments, heating/cooling elements, such as resistive heating elements, or thermo-electric heaters/coolers can be included in the substrate holder 820, as well as the chamber wall of the plasma processing chamber 810 and any other component within the plasma processing system 800.

Additionally, a heat transfer gas can be delivered to the backside of substrate 825 via a backside gas supply system 826 in order to improve the gas-gap thermal conductance between substrate 825 and substrate holder 820. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 825.

In the embodiment shown in FIG. 8, substrate holder 820 can comprise an electrode 822 through which RF power is coupled to the processing plasma in plasma processing region 845. For example, substrate holder 820 can be electrically biased at a RF voltage via the transmission of RF power from a RF generator 830 through an optional impedance match network 832 to substrate holder 820. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 822 at a RF voltage may be pulsed using pulsed bias signal controller 831. The RF power output from the RF generator 830 may be pulsed between an off-state and an on-state, for example.

Alternately, RF power is applied to the substrate holder electrode at multiple frequencies. Furthermore, impedance match network 832 can improve the transfer of RF power to plasma in plasma processing chamber 810 by reducing the reflected power. Match network topologies (e.g. L-type, π-type, T-type, etc.) and automatic control methods are well known to those skilled in the art.

Gas distribution system 840 may comprise a showerhead design for introducing a mixture of process gases. Alternatively, gas distribution system 840 may comprise a multi-zone showerhead design for introducing a mixture of process gases and adjusting the distribution of the mixture of process gases above substrate 825. For example, the multi-zone showerhead design may be configured to adjust the process gas flow or composition to a substantially peripheral region above substrate 825 relative to the amount of process gas flow or composition to a substantially central region above substrate 825.

Vacuum pumping system 850 can include a turbo-molecular vacuum pump (TMP) capable of a pumping speed up to about 8000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 810.

Controller 855 comprises a microprocessor, memory, and a digital I/O port capable of generating control voltages sufficient to communicate and activate inputs to plasma processing system 800 as well as monitor outputs from plasma processing system 800. Moreover, controller 855 can be coupled to and can exchange information with RF generator 830, pulsed bias signal controller 831, impedance match network 832, the gas distribution system 840, vacuum pumping system 850, as well as the substrate heating/cooling system (not shown), the backside gas supply system 826, and/or the electrostatic clamping system 828. For example, a program stored in the memory can be utilized to activate the inputs to the aforementioned components of plasma processing system 800 according to a process recipe in order to perform a plasma assisted process, such as a plasma etch process, on substrate 825.

Controller 855 can be locally located relative to the plasma processing system 800, or it can be remotely located relative to the plasma processing system 800. For example, controller 855 can exchange data with plasma processing system 800 using a direct connection, an intranet, and/or the internet. Controller 855 can be coupled to an intranet at, for example, a customer site (i.e., a device maker, etc.), or it can be coupled to an intranet at, for example, a vendor site (i.e., an equipment manufacturer). Alternatively or additionally, controller 855 can be coupled to the internet. Furthermore, another computer (i.e., controller, server, etc.) can access controller 855 to exchange data via a direct connection, an intranet, and/or the internet.

Other plasma processing systems may include stationary, or mechanically or electrically rotating magnetic field systems, in order to potentially increase plasma density and/or improve plasma processing uniformity, comprise an upper electrode to which RF power can be coupled from RF generator through optional impedance match network, direct current (DC) power supply 890 coupled to the upper electrode opposing substrate, an inductive coil 980 to which RF power is coupled via RF generator 982 through optional impedance match network, inductive coil 1080 that is a "spiral" coil or "pancake" coil in communication with the plasma processing region from above as in a transformer coupled plasma (TCP) reactor, surface wave plasma (SWP) source, and the like. For a more detailed explanation of plasma processing and etch systems, refer to application Ser. No. 13/589,096, filed Aug. 18, 2012, the entire content of which is herein incorporated by reference.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for patterning a substrate using a sidewall image transfer process, comprising:
providing a substrate having a pattern formed in an exposed layer of said substrate, said pattern being characterized by a feature width critical dimension (CD) and said exposed layer being characterized by a film thickness;
conformally depositing a material layer over said pattern;
depositing a second material layer on an exposed surface of said material layer wherein depositing said second material layer uses a tailored process recipe to selectively increase a thickness of said second material layer on regions of said material layer formed on a sidewall of said pattern;
partially removing said material layer using a plasma etching process to expose a top surface of said pattern, open a portion of said material layer at a bottom region between adjacent features of said pattern, and retain a remaining portion of said material layer on said sidewall of said pattern; and
removing said pattern using one or more etching processes to leave a final pattern comprising said remaining portion of said material layer and said second material layer;
wherein the tailored process recipe comprises a tuning bias power during deposition in order to balance deposition amounts between upper and lower surfaces of the substrate and between horizontal and vertical surfaces of the substrate.

2. The method of claim 1, wherein an aspect ratio defined by said film thickness divided by said feature width CD ranges from about 0.5 to 2.5.

3. The method of claim 1, wherein said material layer comprises silicon oxide or silicon nitride.

4. The method of claim 1, wherein said second material layer comprises a low temperature oxide.

5. The method of claim 1, wherein said second material layer contains Si, one or more elements selected from the group consisting of Cl, F, and Br, and one or more elements selected from the group consisting of O and N.

6. The method of claim 1, wherein said depositing said second material layer comprises introducing Si, O, and at least one element selected from the group consisting of F, Cl, and Br to said etching process.

7. The method of claim 6, wherein said depositing said second material layer comprises introducing a film-forming composition containing as incipient ingredients SiCl4 and O2.

8. The method of claim 6, wherein said depositing said second material layer comprises introducing a film-forming composition containing as incipient ingredients SiF4 and O2.

9. The method of claim 1, wherein said depositing said second material layer comprises introducing C and at least one element selected from the group consisting of F and H.

10. The method of claim 1, wherein said depositing said second material layer comprises performing a vapor deposition process in an environment containing C and at least one element selected from the group consisting of F and H.

11. The method of claim 1, wherein said depositing said second material layer comprises performing a plasma-assisted deposition process that includes generating plasma using a film forming process composition containing as incipient ingredients a fluorocarbon gas expressed as $C_xH_yF_z$, where x and z are non-zero.

12. The method of claim 1, wherein said depositing said second material layer comprises performing a plasma-assisted deposition process that includes generating plasma using a film forming process composition containing as incipient ingredients a hydrocarbon gas expressed as $C_xH_y$, where x and y are non-zero.

13. The method of claim 1, wherein said depositing said second material layer is performed during said partially removing.

14. The method of claim 13, wherein at least part of said plasma etching process during said partially removing includes modulating a power level for a radio frequency (RF) bias applied to a substrate holder upon which said substrate rests.

15. The method of claim 14, wherein said power level for said RF bias is modulated between an on and off state.

16. The method of claim 13, wherein at least part of said plasma etching process includes modulating a process pressure.

17. The method of claim 1, wherein said depositing said second material layer is performed immediately following said conformally depositing and prior to said partially removing.

18. The method of claim 1, wherein said exposed layer comprises a layer of radiation-sensitive material.

19. A method for patterning a substrate using a sidewall image transfer process, comprising:
providing a substrate having a pattern formed in an exposed layer, said pattern being characterized by a feature width critical dimension (CD) and said exposed layer being characterized by a film thickness;
conformally depositing a material layer over said pattern wherein
said conformal deposition of said material layer uses a tailored recipe to increase a thickness of said material layer on each feature of said pattern;
partially removing said material layer using a plasma etching process to expose a top surface of said pattern, open a portion of said material layer at a bottom region between adjacent features of said pattern, and retain a remaining portion of said material layer on sidewalls of said pattern; and
removing said pattern using one or more etching processes to leave a final pattern comprising said remaining portion of said material layer;
wherein the tailored process recipe comprises a tuning bias power during deposition in order to balance deposition amounts between upper and lower surfaces of the substrate and between horizontal and vertical surfaces of the substrate.

20. The method of claim 19, wherein an aspect ratio defined by said film thickness divided by said line CD ranges from about 0.5 to 2.5, said material layer comprises silicon oxide or silicon nitride.

* * * * *